United States Patent
Ebinuma

Patent Number: 5,822,043
Date of Patent: Oct. 13, 1998

[54] EXPOSURE METHOD AND PROJECTION EXPOSURE APPARATUS USING THE SAME

[75] Inventor: Ryuichi Ebinuma, Machida, Japan

[73] Assignee: Canon Kabushiki Kaisha, Tokyo, Japan

[21] Appl. No.: 335,394

[22] Filed: Nov. 3, 1994

[30] Foreign Application Priority Data

Nov. 5, 1993 [JP] Japan .................................. 5-276941

[51] Int. Cl.$^6$ ............................ G03B 27/42; G03B 27/52
[52] U.S. Cl. ................................................. 355/55; 355/53
[58] Field of Search ............................... 355/53, 77, 55, 355/50, 67

[56] References Cited

U.S. PATENT DOCUMENTS

| | | | |
|---|---|---|---|
| 4,496,239 | 1/1985 | Isohata et al. | 355/30 |
| 4,503,335 | 3/1985 | Takahashi | 250/548 |
| 4,538,914 | 9/1985 | Yomoda et al. | 356/400 |
| 4,688,932 | 8/1987 | Suzuki | 355/51 |
| 4,924,257 | 5/1990 | Jain | 355/53 |
| 5,168,306 | 12/1992 | Morimoto et al. | 355/53 |
| 5,194,893 | 3/1993 | Nishi | 355/53 |
| 5,317,615 | 5/1994 | Ebinuma et al. | 378/34 |
| 5,347,561 | 9/1994 | Ebinuma | 378/34 |
| 5,377,251 | 12/1994 | Mizusawa et al. | 378/34 |
| 5,477,304 | 12/1995 | Nishi | 355/53 |
| 5,491,534 | 2/1996 | Shiozawa | 355/69 |

FOREIGN PATENT DOCUMENTS 5-15054  2/1993  Japan .

OTHER PUBLICATIONS

Buckley, "Expanding the Horizons of Optical Projection Lithography," Solid State Technology, May 1982, pp. 77 through 82.

*Primary Examiner*—R. L. Moses
*Assistant Examiner*—Shival Virmani
*Attorney, Agent, or Firm*—Fitzpatrick, Cella, Harper & Scinto

[57] ABSTRACT

An exposure method includes the steps of illuminating an original with exposure light having a size b with respect to a scan direction, and projecting a pattern of the illuminated original onto a substrate with a projection magnification $N_{op}$, and scanning the original and the substrate In the scan direction at a speed ratio $N_{st}$ different from the projection magnification $N_{op}$ wherein the speed ratio $N_{st}$ corresponds to the ratio between the speed of the substrate and the speed of the original and, when the minimum linewidth of an image of the pattern with respect to the scan direction is denoted by $\Delta l$, a relation $0<|N_{op}-N_{st}|\cdot b<\Delta l$ is satisfied.

48 Claims, 7 Drawing Sheets

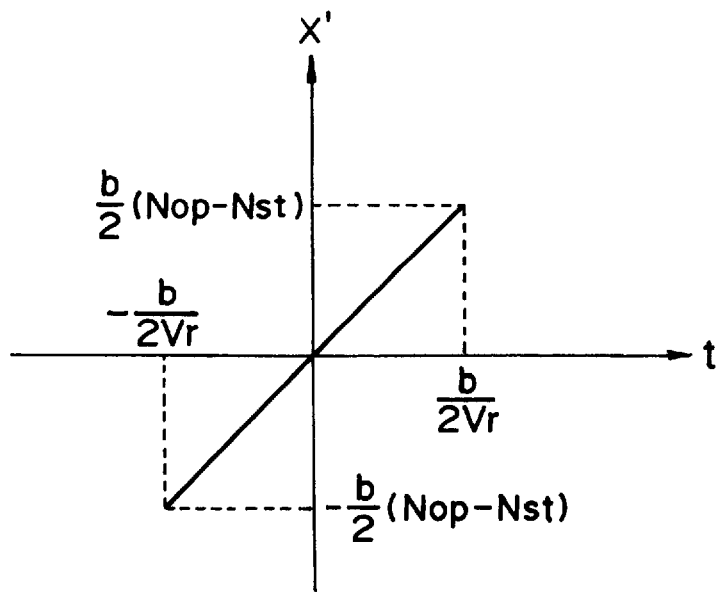
F I G. 3
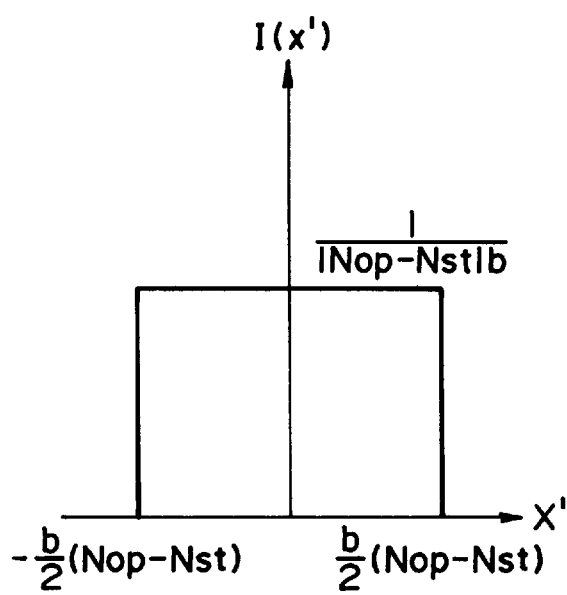
F I G. 4

EXPOSURE METHOD AND PROJECTION EXPOSURE APPARATUS USING THE SAME

FIELD OF THE INVENTION AND RELATED ART

This invention relates to an exposure method and a projection exposure apparatus using the same. More particularly, the invention is concerned with an exposure method for projecting a circuit pattern formed on a reticle onto a wafer to transfer the former to the latter, and a projection exposure apparatus using that method. In another aspect, the invention is directed to a device manufacturing method based on such an exposure method.

In a scanning exposure process, a projection optical system with a preset slit-like exposure region is used to project a pattern of an original, being illuminated with slit-like exposure light, while the original and a substrate are scanningly moved relatively to the exposure light and the projection optical system and in a minor (widthwise) direction of the slit shape, by which the pattern of the original is transferred onto a photosensitive material applied to the substrate. In such a scanning exposure process, usually the projection magnification of the projection optical system and the ratio of the scan speed of the original to the scan speed of the substrate (i.e., the scan speed magnification) are made equal to each other.

A semiconductor chip such as an integrated circuit is manufactured through repetition of this exposure process. In the second time of performing the exposure process and in the exposure processes subsequent thereto, alignment marks of a reticle and a wafer as well as a positional deviation detecting means are used before a start of the exposure operation to detect any positional deviation between the pattern of the reticle and the pattern of the wafer, and a wafer stage and a reticle stage are moved relatively so as to remove the detected positional deviation. This is called an alignment operation. During the scanning exposure operation, therefore, by changing the scan speed ratio, it may be possible to correct, locally, any positional deviation between the substrate and an image of the pattern of the original, which deviation might be attributable to non-isotropic or local distortion of the substrate produced during the substrate processing.

More specifically, plural sets of alignment marks may be provided in the regions of the reticle and the wafer, respectively, which regions are to be scanned by a single scan operation, the sets of marks being arrayed along the scan direction. With respect to each set of marks, any positional deviation between the marks may be detected. Then, during the scanning exposure operation, the ratio of scan speeds of the reticle and the wafer may be changed so as to non-isotropically or locally change the transfer magnification.

However, the exposure operation based on such transfer magnification control may involve a problem, such as described below, If the size of the pattern to be exposed and printed is small.

It is now assumed that the size of the exposure region (illumination zone) to be defined on the original by exposure light (the width of a slit where the exposure region has a slit-like shape) is denoted by b, and the projection magnification of the projection optical system is denoted by $N_{op}$. As a certain point R on the original moves and passes the exposure region with the scan movement, the projected image $R_{im}$ thereof on the substrate displaces. The amount of displacement of the projected image is equal to the product $N_{op}$·b of the size b and the magnification $N_{op}$ of the optical system. On the other hand, it is assumed that the speed of scanning movement of the original is denoted by $V_r$, and the scanning speed of the substrate is denoted by $V_w$. Since the time period $T_{ex}$ necessary for the point R on the original to pass through the exposure region is $b/V_r$, the amount of displacement of a point W on the substrate corresponding to the point R on the original is $V_w T_{ex}=(V_w/V_r)·b$. If, therefore, the projection magnification $N_{op}$ of the projection optical system differs from the scan speed magnification $N_{st}=V_r/V_w$, then the amount of displacement of the projected image of the original and the amount of displacement of the substrate during the exposure operation do not exactly correspond to each other. If this occurs, it results in blurring of the projected image to be transferred to the substrate. While the degree of this image blur might depend on the intensity distribution in the exposure region by the exposure light in the scan direction. a large difference In displacement between the substrate and the projected image of the original will cause a problem of degradation of resolution by the image blur.

SUMMARY OF THE INVENTION

It is accordingly an object of the present invention to provide an improved exposure method by which high resolution is attainable stably.

It is another object of the present invention to provide an improved exposure apparatus based on such exposure method.

It is a further object of the present invention to provide an improved device manufacturing method based on such an exposure method.

In accordance with an aspect of the present invention, there is provided an exposure method including a step of scanning an original and a substrate relative to exposure light and to a projection optical system to thereby project a pattern of the original onto the substrate through the projection optical system, said method by satisfying the following relation when the original and the substrate are scanned at a speed ratio $N_{st}$ different from the projection magnification $N_{op}$ of the projection optical system:

$$0<|N_{op}-N_{st}|·b<\Delta l$$

where b is the width of the exposure region defined by the exposure light on the substrate, $\Delta l$ is the minimum linewidth, on the substrate, of a pattern as being projected on the substrate.

In one preferred form of this aspect of the present invention, the scan exposure is carried out while changing the value b in accordance with the values of $|N_{op}-N_{st}|$ and $\Delta l$.

In another preferred from of this aspect of the present invention, the scan exposure is carried out while changing the illuminance distribution in the exposure region with respect to the scan direction, in accordance with the values of $|N_{op}-N_{st}|$, $\Delta l$ and b.

In accordance with another aspect of the present invention, there is provided a projection exposure apparatus for transferring a device pattern of a reticle onto a workpiece on the basis of the exposure method described above, In accordance with a further aspect of the present invention, there is provided a device manufacturing method which includes a step of transferring a device pattern of a reticle onto a workpiece on the basis of the exposure method described above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 is a graph for explaining changes in the relative position of a wafer and a reticle.

FIG. 4 is a graph for explaining an intensity distribution of a pattern image being displaced.

DESCRIPTION OF THE PREFERRED EMBODIMENTS

Figure 1:
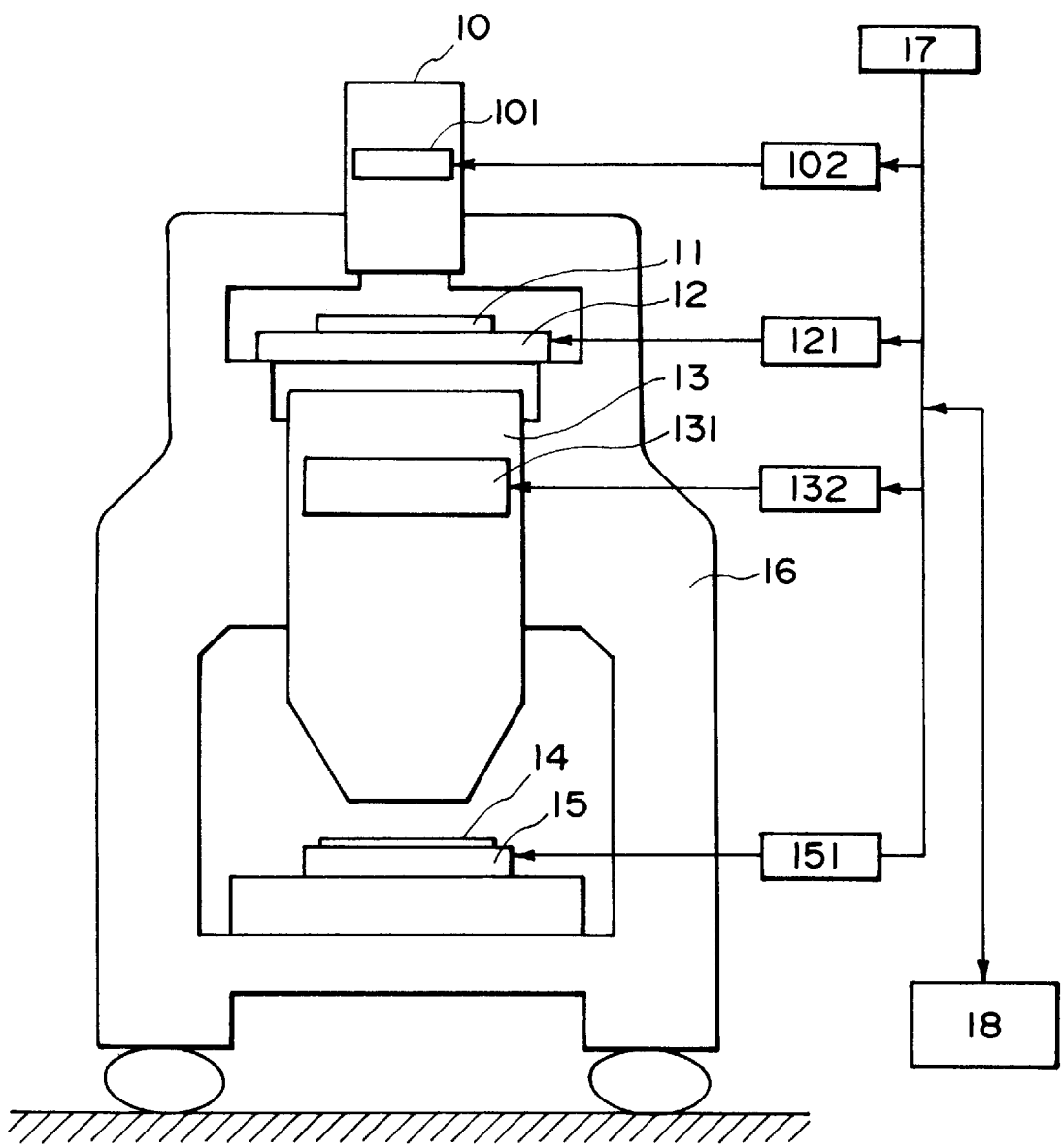
FIG. 1 is a schematic view of a projection exposure apparatus according to an embodiment of the present invention.

FIG. 1 is a schematic view of a projection exposure apparatus according to an embodiment of the present invention. This exposure apparatus is arranged to project, in a reduced scale, a device pattern formed on a reticle (original) onto a wafer with slit-like exposure light and through a projection optical system, while scanningly moving the reticle and the wafer in synchronism with each other, to thereby transfer the whole device pattern of the reticle onto a predetermined zone of the wafer. The exposure apparatus is further arranged to move the wafer stepwise, so that the scanning exposure operation described above is repeated with respect to each of different zones, so that device patterns are printed on the whole surface of the wafer.

Denoted in FIG. 1 at 10 is an illumination means which serves to define, with exposure light, an exposure region of rectangular (slit-like) shape on the reticle. The illumination means 10 includes illumination region changing means 101 which serves to change the size of the exposure region or to change the intensity distribution of the exposure light, upon the reticle. Denoted at 102 is a control means for the illumination region changing means. Denoted at 11 is a reticle, and denoted at 12 is a reticle stage for scanningly moving the reticle. The reticle stage 12 is provided with a driving means (not shown) and a guide means (not shown), both for scanning movement of the reticle, as well as a measuring means (not shown) for measuring the position of the reticle 11 In the scan direction. The reticle stage 12 is controlled by a reticle stage control means 121, by which the scanning movement speed $V_r$ of the stage 12 during the exposure operation can be changed.

Denoted at 13 is a projection optical system for projecting a device pattern of the reticle 11, as illuminated by the illumination means 10, onto a wafer in a reduction magnification $N_{op}$. This reduction magnification $N_{op}$ can be changed by displacing (to change the position of) a certain lens or lenses of the projection optical system along the optical axis thereof. Denoted at 131 is a magnification changing means for the optical system 13, including that movable lens or lenses. It is controlled by a magnification control means 132, by which the magnification of the optical system 13 can be changed.

Denoted at 14 is a wafer having its surface coated with a photosensitive material. Denoted at 15 is a wafer stage for moving the wafer, and the wafer stage 15 is provided with driving means (not shown) and a guide means (not shown), both for moving the wafer in the scan direction and in a direction perpendicular to the scan direction, as well as a measuring means (not shown) for measuring the position and attitude of the wafer stage 15. The wafer stage 15 is controlled by a wafer stage control means 151, by which the scanning movement speed $V_w$ of the stage 15 during the exposure operation can be changed. Denoted at 16 is a frame member on which the reticle stage 12, the projection optical system 13 and the wafer stage 15, for example, are mounted. Denoted at 17 is a detecting means of a known type, for detecting a relative positional deviation between a pattern of the reticle and a pattern of the wafer. Denoted at 18 is a control means for controlling the exposure apparatus as a whole.

The problem to be solved in this embodiment as well as the operation of the exposure apparatus of this embodiment, will be explained in greater detail below.

Figure 2:
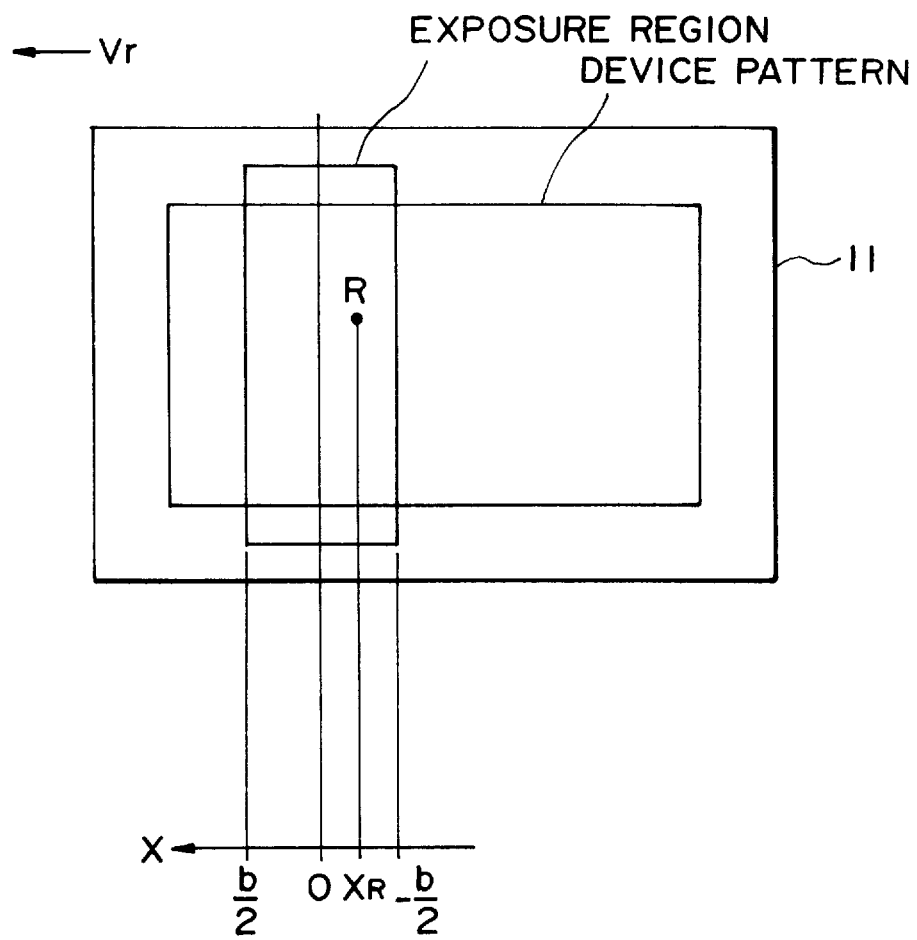
FIG. 2 is a schematic view for explaining a positional relationship between a reticle and an exposure region.

First, the intensity profile of a projected image will be explained. As shown in FIG. 2, a coordinate system of the reticle stage is defined with the center of the exposure region by the exposure light being taken as an origin and the position in the scanning movement direction being taken as X. If the position of a point R on the reticle with respect to this coordinate system is $X_R$, if the scan speed $V_r$ change during the period in which this point passes the exposure region is small and if the time moment at which it passes the line X=0 is t=0, then the following is given:

$$X_R = V_r t \tag{1}$$

If the width (size) of the exposure region in the scanning movement direction as defined by the illumination means 10 is denoted by b, the boundary of the exposure region in the coordinate system of the reticle stage 12 is at the positions of $-b/2$ and $b/2$. Thus, the moment $t_1$ of start of exposure and the moment $t_2$ of end of exposure are expressed by:

$$t_1 = -b/2V_r \tag{2}$$

$$t_2 = b/2V_r \tag{3}$$

A coordinate system for the wafer stage 15 is defined with its origin taken on the point upon the wafer whereat the origin of the coordinate system of the reticle stage 12 is projected by the projection optical system 13 on the wafer, and the position in the scanning movement direction being taken as x. If a projection optical system without any blur and with even projection magnification is considered, within the exposure region, the coordinate system of the reticle stage 12 and the coordinate system of the wafer stage 15 are correlated with each other through coordinate transformation such as follows:

$$x = N_{op} X \tag{4}$$

The position $x_r$ of a projected image $R_{im}$ of the point R on the reticle 11, with respect to the coordinate system of the wafer stage 15 is:

$$x_r = N_{op} X_R \tag{5}$$

On the other hand, the position $x_w$, with respect to the coordinate system of the wafer stage 15, of a point W on the wafer 14 which becomes coincident with the position of the projected image $R_{im}$ at the time moment t=0, is expressed by:

$$x_w = V_w t \quad (6)$$

From equations (1), (5) and (6), the difference x' between the position of the point $R_{im}$ and the position of the point W can be expressed as follows:

$$\begin{aligned} x' &= x_r - x_w \\ &= (N_{op}V_r - V_w)t \\ &= (N_{op} - N_{st})V_r t \end{aligned} \quad (7)$$

where $N_{st} = V_w/V_r$ wherein x' defines the position with respect to a coordinate system which is fixed on the wafer 14, taking the point W as an origin. The coordinate transformation from $x_r$ to x' is given from equations (1), (5) and (7), and by the following equation:

$$x' = (1 - N_{st}/N_{op})x_r \quad (8)$$

While equation (3) may be depicted such as shown in FIG. 3, if $N_{op}$ and $N_{st}$ are different from each other, then as suggested by this equation, the projected image of the reticle 11 displaces relative to the corresponding point on the wafer surface. Actually, the pattern of the reticle 11 is imaged on the wafer 14 with blurring depending on the resolution of the projection optical system. If, therefore, the magnification of the projection optical system and the scan speed ratio are different from each other, the quantity of image blur increases.

Now, how the resolution is degraded by the displacement of the projected image as represented by equation (7), will be explained. As a reticle projected image on the wafer 14, a sine wave pattern having a predetermined spatial frequency and a contrast of 1 is assumed, and how the contrast of this pattern is lowered by averaging through the displacement is calculated to determine the decrease of resolution. Making this calculation to patterns of various spatial frequencies may be arithmetically equivalent to assuming a pattern as represented by a δ function and Fourier transforming the displaced image of the δ function pattern, that is, the intensity distribution shape as decentralized by the displacement. This intensity distribution profile is obtainable by applying a weight of the intensity of the exposure light to the probability density of existence time with respect to the relative position, attributable to the relative movement of the reticle image and the water 14. The illumination intensity on the wafer 14 is now taken as a function having a distribution in the scan direction, and it is denoted by E(x). The intensity distribution shape of the displaced image is taken as a function of the relative position x', and it is denoted by I(x'). I(x') is a standardized function, and it is expressed by:

$$\int I(x')dx' = 1 \quad (9)$$

I(x') can be determined as the density of proportion r(x') by which the total exposure amount $E_{all}$ is occupied by the exposure amount as provided by projected light within a time period Δt in which the point $R_{im}$ is present in a small region Δx'. Namely:

$$r(x') = E(x_r)\Delta t/E_{all} \quad (10)$$

$$E_{all} = \int_{t1}^{t2} E(x_r)dt \quad (11)$$

$$I(x') = \lim_{\Delta x' \to 0} [r(x')/\Delta x'] \quad (12)$$

Also, from equation (7), it follows that;

$$\lim_{\Delta x' \to 0} [\Delta t/\Delta x'] = \{1/|(N_{op} - N_{st})V_r|\} \quad (13)$$

From equations (2), (3) and (8) and from equations (10), (11), (12) and (13), it follows that:

$$|x'| \le |N_{op} - N_{st}| \cdot b/2; I(x') = E(x)/\{|1 - (N_{st}/N_{op})| \int_{-N_{op}(b/2)}^{N_{op}(b/2)} E(x)dx \quad (14)$$

$$|x'| > |N_{op} - N_{st}| \cdot b/2; I(x') = 0 \quad (15)$$

where $$x' = (1 - N_{st}/N_{opr})x$$

Equation (14) represents that I(x') has a shape analogous to the intensity distribution of the exposure light in the scan direction. The Fourier transformation F(u) of equation (14), taking u of the spatial frequency to x', is the M.T.F. of the image to be transferred from the image provided by the projection optical system 13. F(u) provides an index for a decrease in contrast and a decrease in resolution attributable to relative displacement of the projected image and the wafer 14. On an occasion when the exposure light has a uniform distribution within the exposure region, with respect to the scan direction, E(x)=const. and, therefore:

$$I(x') = 1/[|N_{op}N_{st}|b] \quad (16)$$

Equation (16) is represented in FIG. 4. Taking Fourier transformation F(u) of equation (16), it follows that:

$$F(u) = [\sin(\pi|N_{op}-N_{st}|bu)]/[|N_{op}-N_{st}|bu] \quad (17)$$

According to equation (17), F(u)=0 if $|N_{op}-N_{st}|bu=\frac{1}{2}$. This means that, under this condition, the contrast becomes zero. If the linewidth of a pattern on a wafer 1 to be exposed is denoted by Δl, the spatial frequency of the pattern is generally u=½Δl. Thus, in order to retain the contrast, at least the following condition should preferably be satisfied;

$$\pi|N_{op}-N_{st}|b(\tfrac{1}{2}\Delta l) < \pi/2 \quad (18)$$

Namely, $$0 < |N_{op}-N_{st}|b < \Delta l \quad (19)$$

Since the pattern transferred should retain a contrast necessary for a resist process, in addition to the the product of F(u) according to equation (17) and the M.T.F. of the protection optical system 13, attention should be paid to other factors of degrading the resolution such as by vibration, for example. While the situation differs in dependence upon exposure apparatuses, setting a higher level F(u) may be preferable for enhanced resolution. If, for example, in order to attain a resolution necessary for a resist, a limitation such as follows $$F(u) \ge 0.8$$

is set, then in accordance with equation (17) the following relation should be satisfied:

$$|N_{op}N_{st}|b \ge 0.72\Delta l$$

If the linewidth of a pattern to be exposed is 0.4 micron, then:

$$|N_{op}-N_{st}|b \leq 0.288 \text{(micron)}$$

On an occasion when the size of the exposure region on the reticle is fixed during the exposure operation, for example, if b=10 mm, then the following limitation should preferably be set:

$$|N_{op}-N_{st}|b \leq 28.8 \text{(ppm)}$$

On the other hand, if the exposure light has an intensity distribution in which the intensity at the middle portion of the exposure region is larger than that in the peripheral portion, even with the same width (size) of the exposure region, a larger M.T.F. is attainable as compared with a case, wherein the intensity distribution is even. For example, in a case of an intensity distribution of Gaussian distribution shape, the contrast becomes higher with a smaller o. Since, even on such an occasion, the M.T.F can be determined by Fourier transformation of equation (14), it is possible to determine the conditions of $|N_{op}-N_{st}|$, b and E(x) necessary for retaining the contrast to a size Δl of a pattern to be exposed (printed).

Figure 5:
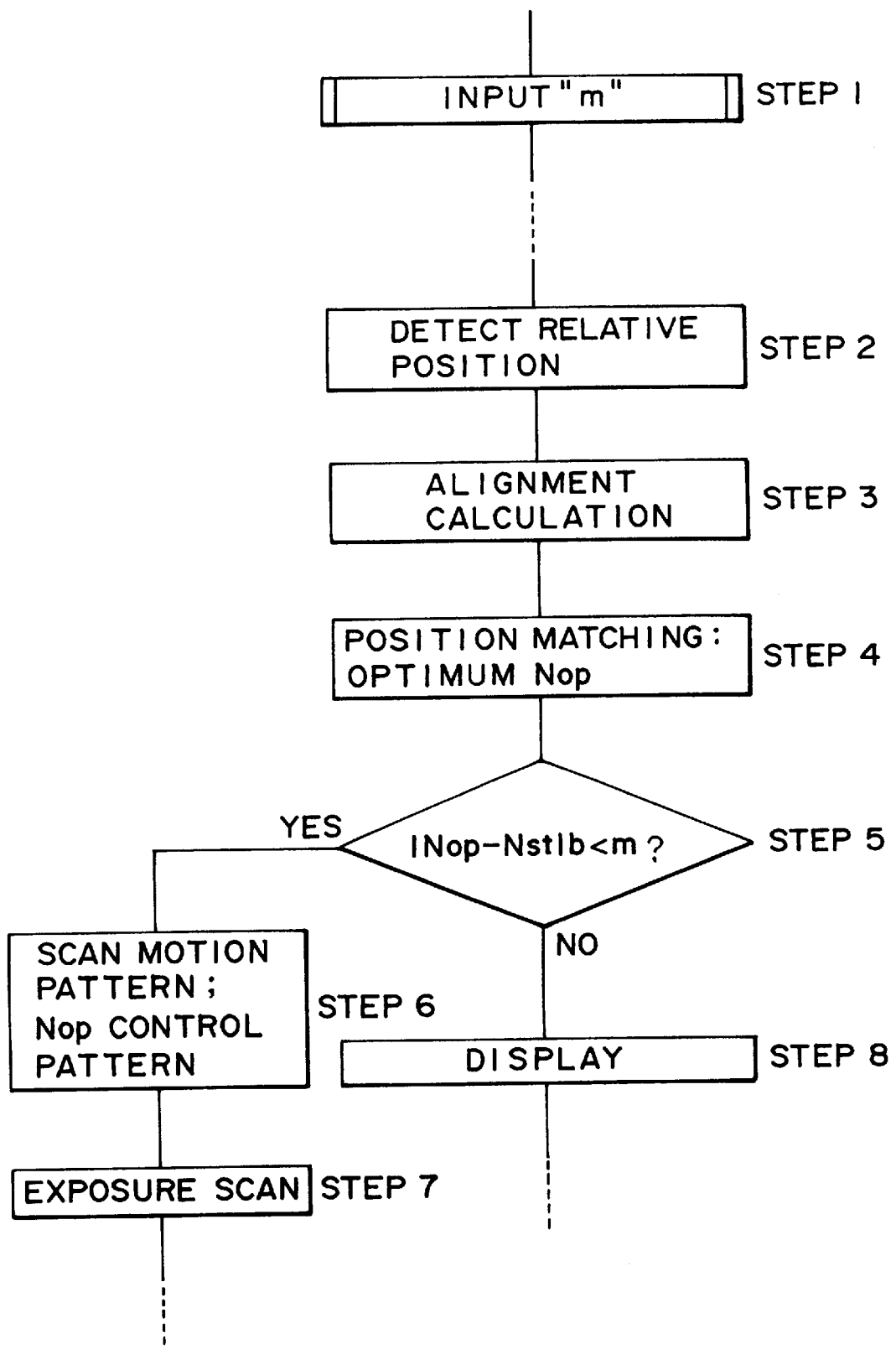
FIG. 5 is a flow chart for explaining the operation of the exposure apparatus of FIG. 1.

FIG. 5 is a flow chart of the exposure operation of the exposure apparatus of FIG. 1. An upper limit m to $|N_{op}-N_{st}|b$ as determined, for example, by a resist used, the minimum size Δl among the pattern (image) to be projected on the wafer and the resolution of the projection optical system 13 of the exposure apparatus, is inputted into the control means of the exposure apparatus previously. The value m is selected in the range:

$$m \leq \Delta l$$

The size b is set previously, and the scanning movement speed of the wafer 14 is determined in accordance with the size b (Step 1). After preparation prior to the exposure process, such as setting a reticle 11 and loading a wafer 14 on the exposure apparatus, the detecting means 17 detects the relative position of alignment marks of the reticle 11 and the wafer 14 before a start of the exposure process (Step 2).

The information obtained at Step 2 is supplied to the control means 18, by which calculation and correction for alignment (registration) of the wafer pattern and the reticle pattern are carried out (Step 3).

On the basis of the result of Step 4, the control means 18 then calculates the positional matching pattern (speed ratio pattern) for the scanning movement of the wafer stage and the scanning movement of the reticle stage so as to reduce positional deviation in the exposure scan, as well as the control pattern for the magnification of the projection optical system at every position during the scanning movement (Step 4). It is to be noted that, while the scanning movement is continuous, if the measured values of the relative position obtained by the detecting means 17 are those concerning a number of discrete positions along the scan direction, the measured values may be connected by a smooth curve to complement the data concerning those positions not measured. Also, the projection magnification or the projection optical system 13 may be held unchangeable during the scanning movement, rather than being changed in the scanning movement as in this embodiment.

Subsequently, with regard to each position in the scan direction, the product $|N_{op}-N_{st}|b$ of the difference, between the projection magnification of the projection optical system 13 and the scan speed ratio of the reticle and the wafer, and the width (size) b of the exposure region upon the reticle in the scan direction is calculated. The control means 18 compares the result with the upper limit m inputted previously (Step 5) and, if at every position the former is smaller than the latter, then the control means prepares (i) a scanning movement pattern for a wafer stage to make the movement speed substantially constant so as to assure an optimum exposure amount with respect to the resist, (ii) a scanning movement pattern for a reticle stage to be matched with this, the wafer stage scanning movement pattern in accordance with the result of calculation at Step 4, and (iii) a control pattern for the magnification of the projection optical system 13. These patterns are represented in terms of control commands with respect to time (Step 6). The control means 18 then applies these commands to the wafer stage control means 151, the reticle stage control means 121 and the magnification control means 131 of the projection optical system, respectively, and carries out the scanning exposure operation (Step 7).

If the product $|N_{op}-N_{st}|b$ is beyond the upper limit m even with regard to one position, it means that the desired resolution is not attainable. Thus, the exposure process is not directly started, but necessary procedures predetermined are taken (Step 8). As regards such procedures, as an example, the scanning exposure for that region may be interrupted and the exposure process may be advanced to exposure of a next region on the same wafer. Alternatively, the exposure process to that wafer may be discontinued, and the wafer may be replaced by another and the exposure process of the fresh wafer may be started. Further, the operation of the exposure apparatus may be interrupted for discrimination by an operator As a still further alternative, the scanning movement pattern or the magnification control pattern for the projection optical system may be remade, and the calculation of the product $|N_{op}-N_{st}|b$ as well as the comparison with the limit m may be done once more. Still further, the width b of exposure light may be made smaller by using the control means 102 and the changing means 101, and the exposure process may be done with the smaller width. If the minimum pattern size is changing locally, different upper limits m may be set in accordance with the locations, and more exact checking may be made.

Figure 6:
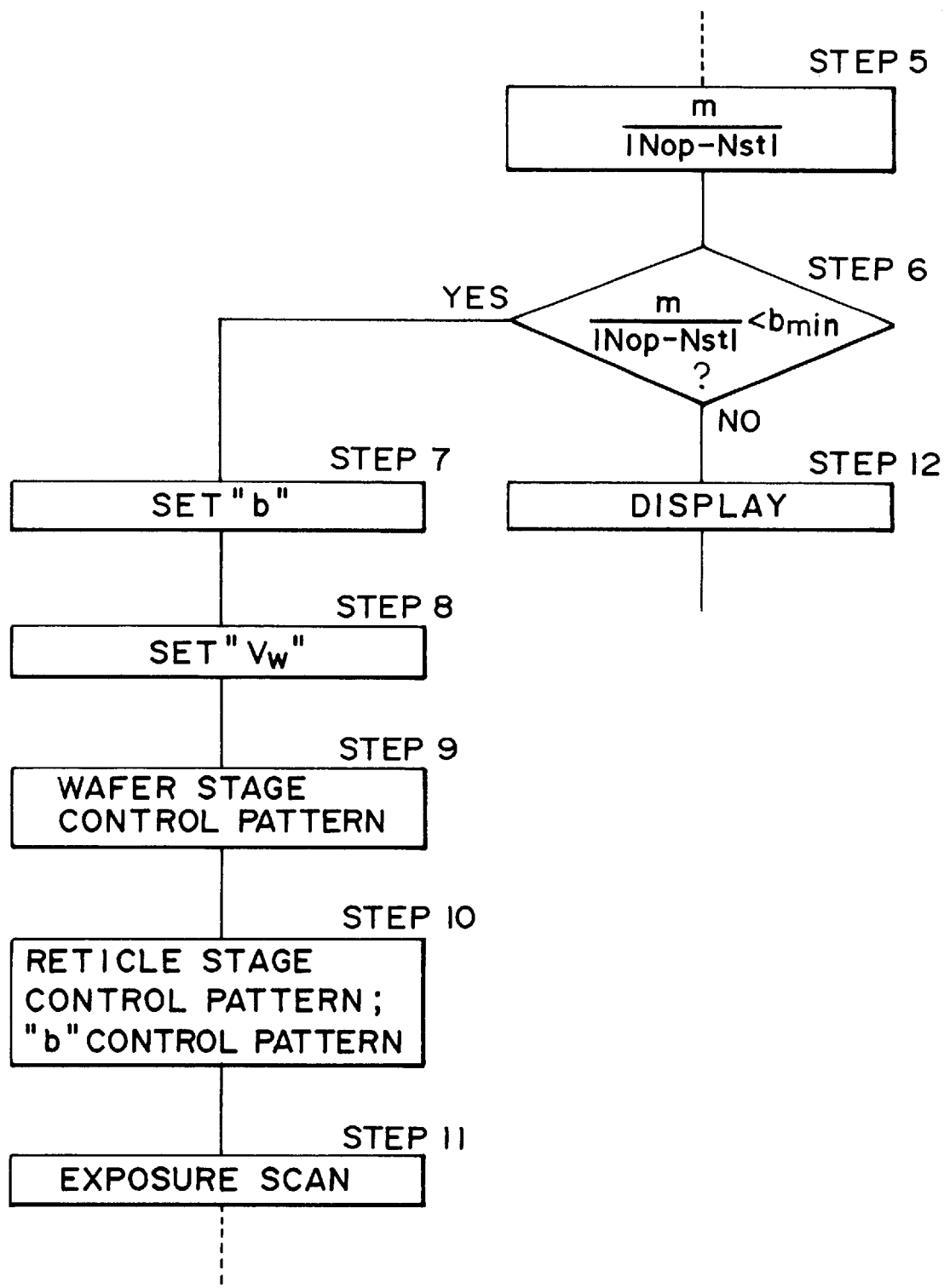
FIG. 6 is a flow chart for explaining a modified operation of the exposure apparatus of FIG. 1.

FIG. 6 is a flow chart of a modified exposure operation to be made by the exposure apparatus of FIG. 1.

FIG. 6 shows an example wherein the width (size) b of the exposure region is changed during the scanning exposure, by using the illumination region changing means 101. The sequential operations up to Step 4 in FIG. 6 correspond to those of the flow chart of FIG. 5. At the subsequent step, with regard to each point in the direction of scanning movement, $m/|N_{op}-N_{st}|$ is calculated (Step 5). If there is a location whereat the value of $m/|N_{op}-N_{st}|$ is smaller than a minimum $b_{min}$ of the size b of the exposure region that can be set by the illumination region changing means 101, necessary procedures predetermined may be done (Step 6). As regards such procedures, as an example, the scanning exposure for that region may be interrupted and the exposure process may be advanced to exposure of a next region on the same wafer. Alternatively, the exposure process to that wafer may be discontinued, and the wafer may be replaced by another and the exposure process of the fresh wafer may be started. Further, the operation of the exposure apparatus may be interrupted for discrimination by an operator. As a still further alternative, the scanning movement pattern or the magnification control pattern for the projection optical system may be remade, and the calculation of the product $|N_{op}-N_{st}|b$ as well as the comparison with the limit m may be done once more. If the relation $$b_{min} \leq m/|M_{op}-N_{st}|$$

is satisfied with regard to every position, the control pattern for the size b at respective positions in the scanning movement is determined by the following procedure .

For a location whereat the value $m/|N_{op}-N_{st}|$ (including $|N_{op}-N_{st}|=0$) is larger than a maximum $b_{max}$ of the size b that can be set, the size b is set as $b=b_{max}$. For other locations, $b=m/|N_{op-Nst}|$ is set (Step 7). Subsequently, stage scanning movement patterns which can meet changes in b at respective positions are prepared. First, optimum scan speeds of the wafer stage 15 at respective positions are calculated so as to ensure optimum exposure amount and optimum exposure time to the resist. As an example, if the intensity of the exposure light is constant irrespective of the magnitude of b, a scan speed proportional to b may be adopted (Step 8).

Subsequently, a scanning movement pattern for the wafer stage 15 is prepared. This pattern can be represented in terms of a position command with respect to time. This calculation is equivalent to solving a differential equation as expressed in terms of the speed with respect to time, as obtainable at Step 8 (Step 9). Then, on the basis of the result of calculation at Step 4, a scanning movement pattern for the reticle stage 12, being matched to the scan movement pattern of the wafer stage 15, is prepared. Also, a control pattern for magnification $N_{op}$ of the projection optical system 13 as well as a control pattern for the size b of the exposure region are prepared, both in terms of a command with respect to time (Step 10). Subsequently, the thus prepared commands are applied to the wafer stage control means 151, the reticle stage control means 121, the magnification control means 131 of the projection optical system 13 and the illumination region changing means 101, and the scanning exposure operation is carried out (Step 11).

In a case wherein the illumination region changing means 101 is provided with a function for changing the intensity distribution of the exposure light upon the reticle 11 and in the scan direction, in place of or in addition to the control amount b at Step 6, Step 7 and Step 8 in the flow of FIG. 6, control amounts representative of the expansion of the illumination intensity distribution may be defined, and these control amounts may be controlled within a range in which a necessary contrast is obtainable. These control amounts may be determined from the pattern size $\Delta l$ and the intensity distribution, by calculation according to equation (14). Also, from the control pattern for the illumination intensity and in a similar procedure like that of Step 9 of FIG. 6, stage scanning movement designating patterns may be determined.

While in the foregoing description the invention has been explained with reference to an example of an exposure apparatus for the manufacture of devices such as semiconductor chips, having a projection optical system with a reduction magnification, the invention is also applicable to any other type of scanning exposure apparatus wherein the transfer magnification in the scan direction can be changed by changing the scanning movement speed ratio.

Next, an embodiment of a device manufacturing method of the present invention which uses an exposure apparatus of the type described hereinbefore, will be explained.

Figure 7:
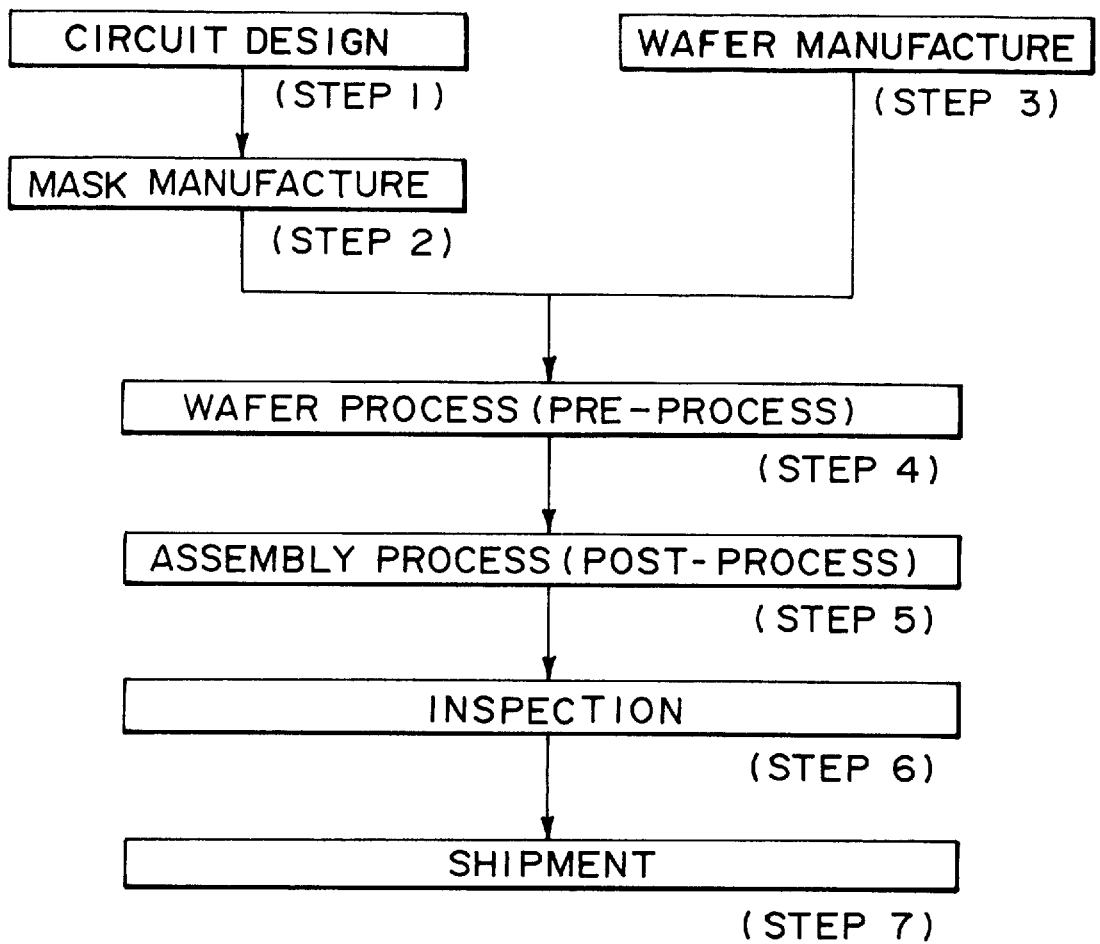
FIG. 7 is a flow chart of semiconductor device manufacturing processes.

FIG. 7 is a flow chart of the sequence of manufacturing a semiconductor device such as a semiconductor chip (e.g., IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material 6uch as silicon.

Step 4 is a wafer process which is called a pre-process wherein, by using the so prepared mask and wafers circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing) Step 6 is an inspection step wherein an operability check, a durability check and so on of the semiconductor devices produced by step 5 are carried out. With these processes, semiconductor devices are finished and they are shipped (step 7).

Figure 8:
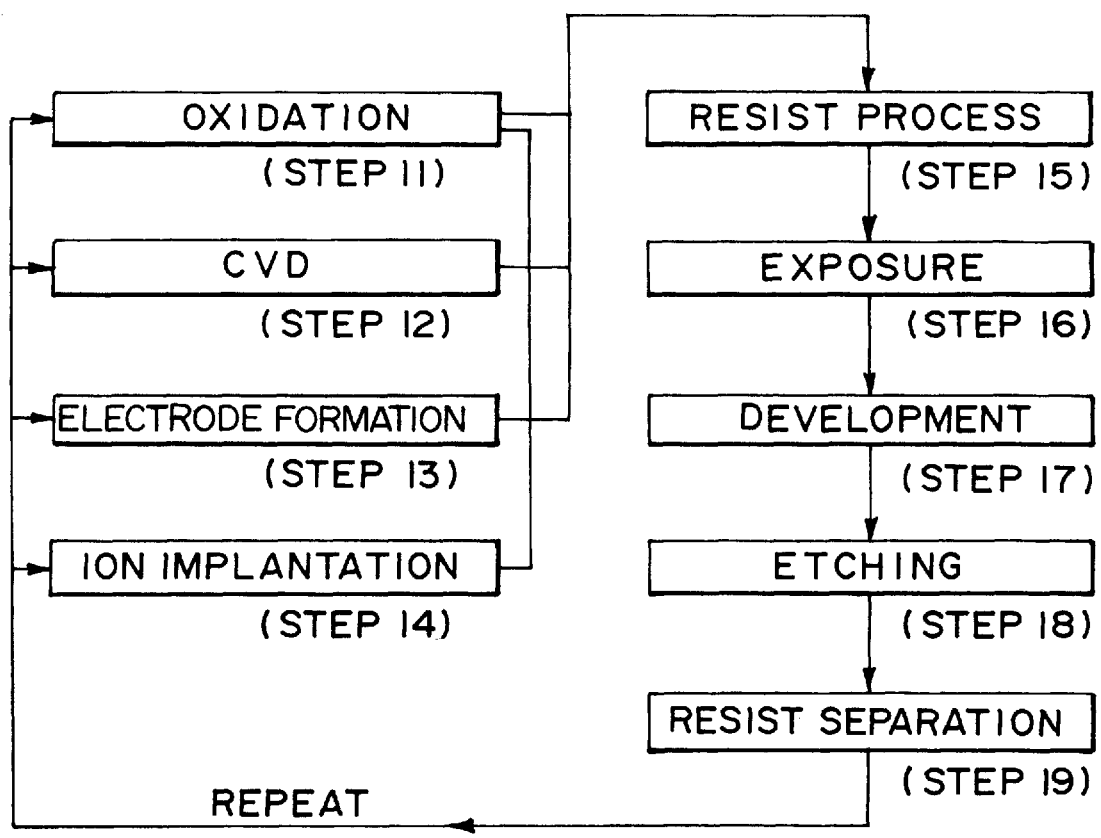
FIG. 8 is a flow chart of a wafer process of FIG. 7.

FIG. 8 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the water.

While the invention has been described with reference to the structures disclosed herein, it is not confined to the details set forth and this application is intended to cover such modifications or changes as may come within the purposes of the improvements or the scope of the following claims.

What is claimed is:

1. An exposure method, comprising the steps of:
    illuminating an original with exposure light having a size b with respect to a scan direction, and projecting a pattern of the illuminated original onto a substrate with a projection magnification $N_{op}$; and
    scanning the original and the substrate in the scan direction at a speed ratio $N_{st}$ different from the projection magnification $N_{op}$, wherein the speed ratio $N_{st}$ corresponds to the ratio between the speed of the substrata and the speed of the original and, when the minimum linewidth of an image of the pattern with respect to the scan direction is denoted by $\Delta l$, a relation $0<|N_{op}-N_{st}|\cdot b<\Delta l$ is satisfied.

2. A method according to claim 1, wherein said illuminating step includes changing the size b of the exposure light during the scan.

3. A method according to claim 1, wherein said illuminating step includes changing an intensity distribution of the exposure light with respect to the scan direction, during the scan.

4. A method according to claim 1, wherein said scanning step includes changing the speed ratio $N_{st}$ during the scan.

5. A method according to claim 4, wherein said projecting step includes changing the projection magnification $N_{op}$ during the scan.

6. A method according to claim 4, wherein said illuminating step includes changing the size b of the exposure light during the scan.

7. A method according to claim 4, wherein said illuminating step includes changing an intensity distribution of the exposure light with respect to the scan direction, during the scan.

8. A method according to claim 5, wherein said illuminating step includes changing the size b of the exposure light during the scan.

9. A method according to claim 5, wherein said illuminating step includes changing an intensity distribution of the exposure light with respect to the scan direction, during the scan.

10. A method according to claim 1, wherein said projecting step includes changing the projection magnification $N_{op}$ during the scan.

11. A method according to claim 10, wherein said illuminating step includes changing the size b of the exposure light during the scan.

12. A method according to claim 10, wherein said illuminating step includes changing an intensity distribution of the exposure light with respect to the scan direction, during the scan.

13. A method according to claim 1, wherein a relation $|N_{op}-N_{st}|\cdot b<0.72\cdot\Delta l$ is satisfied.

14. A method according to claim 1, further comprising discriminating whether a relation $|N_{op}-N_{st}|\cdot b<\Delta l$ is satisfied and discontinuing the scanning exposure when the relation is not satisfied, wherein said discriminating step and said discontinuing step are carried out before said illuminating step and said scanning step.

15. An exposure method, comprising the steps of:
illuminating an original with exposure light and projecting, by a projection optical system, a pattern of the illuminated original onto a substrate with a projection magnification of the projection optical system;
scanning the original and the substrate in a scan direction; and
changing the projection magnification during the scan, by adjusting the projection optical system, so that an image of the pattern is superposed on a pattern region on the substrate.

16. A method according to claim 15, wherein said scanning step includes changing a ratio between a scan speed of the original and a scan speed of the substrate.

17. A projection exposure apparatus comprising:
illuminating means for illuminating an original with exposure light having a size b with respect to a scan direction, and projecting a pattern of the illuminated original onto a substrate with a projection magnification $N_{op}$; and
scanning means for scanning the original and the substrate in the scan direction at a speed ratio $N_{st}$ different from the projection magnification $N_{op}$, wherein the speed ratio $N_{st}$ corresponds to the ratio between the speed of the substrate and the speed of the original and, when the minimum linewidth of an image of the pattern with respect to the scan direction is denoted by $\Delta l$, a relation $0<|N_{op}-N_{st}|\cdot b<\Delta l$ is satisfied.

18. An apparatus according to claim 17, wherein said illuminating means comprises means for changing the size b of the exposure light during the scan.

19. An apparatus according to claim 17, wherein said illuminating means comprises means for changing an intensity distribution of the exposure light with respect to the scan direction, during the scan.

20. An apparatus according to claim 17 wherein said scanning means comprises means for changing the speed ratio $N_{st}$ during the scan.

21. An apparatus according to claim 20, wherein said projecting means comprises means for changing the projection magnification $N_{op}$ during the scan.

22. An apparatus according to claim 20, wherein said illuminating means comprises means for changing the size b of the exposure light during the scan.

23. An apparatus according to claim 20, wherein said illuminating means comprises means for changing an intensity distribution of the exposure light with respect to the scan direction, during the scan.

24. An apparatus according to claim 21, wherein said illuminating means comprises means for changing the size b of the exposure light during the scan.

25. An apparatus according to claim 21, wherein said illuminating means comprises means for changing an intensity distribution of the exposure light with respect to the scan direction, during the scan.

26. An apparatus according to claim 17, wherein said projecting means comprises means for changing the projection magnification $N_{op}$ during the scan.

27. An apparatus according to claim 26, wherein said illuminating means comprises means for changing the size b of the exposure light during the scan.

28. An apparatus according to claim 26, wherein said illuminating means comprises means for changing an intensity distribution of the exposure light with respect to the scan direction, during the scan.

29. An apparatus according to claim 17, wherein a relation $|N_{op}-N_{st}|\cdot b<0.72\cdot\Delta l$ is satisfied.

30. An apparatus according to claim 17, further comprising discriminating means for discriminating whether a relation $|N_{op}-N_{st}|\cdot b<\Delta l$ is satisfied and discontinuing means for discontinuing the scanning exposure when the relation is not satisfied, wherein said discriminating means and said discontinuing means are operated before said illuminating means and said scanning means.

31. A projection exposure apparatus comprising:
illuminating means for illuminating an original with exposure light and for projecting, by a projection optical system, a pattern of the illuminated original onto a substrate with a projection magnification of the projection optical system;
scanning means for scanning the original and the substrate in a scan direction; and
changing means for changing the projection magnification during the scan by said scanning means, by adjusting the projection optical system, so that an image of the pattern is superposed on a pattern region on the substrate.

32. An apparatus according to claim 31, wherein said scanning means comprises means for changing a ratio between a scan speed of the original and a scan speed of the substrate.

33. A device manufacturing method for manufacturing a device, said method comprising the steps of:
illuminating an original with exposure light having a size b with respect to a scan direction, and projecting a pattern of the illuminated original onto a substrate with a projection magnification $N_{op}$; and
scanning the original and the substrate in the scan direction at a speed ratio $N_{st}$ different from the projection magnification $N_{op}$, to manufacture a device, wherein the speed ratio $N_{st}$ corresponds to the ratio between the speed of the substrate and the speed of the original and, when the minimum linewidth of an image of the pattern with respect to the scan direction is denoted by $\Delta l$, a relation $0<|N_{op}-N_{st}|\cdot b<\Delta l$ is satisfied.

34. A method according to claim 33, wherein said illuminating step includes changing the size b of the exposure light during the scan.

35. A method according to 33, wherein said illuminating step includes means for changing an intensity distribution of the exposure light with respect to the scan direction, during the scan.

36. A method according to claim 33, wherein said scanning step includes changing the speed ratio $N_{st}$ during the scan.

37. A method according to claim 36, wherein said projecting step includes changing the projection magnification $N_{op}$ during the scan.

38. A method according to claim 36, wherein said illuminating step includes changing the size b of the exposure light during the scan.

39. A method according to claim 36, wherein said illuminating step includes changing an intensity distribution of the exposure light with respect to the scan direction, during the scan.

40. A method according to claim 37, wherein said illuminating step includes changing the size b of the exposure light during the scan.

41. A method according to claim 37, wherein said illuminating step includes changing an intensity distribution of the exposure light with respect to the scan direction, during the scan.

42. A method according to claim 33, wherein said projecting step includes changing the projection magnification $N_{op}$ during the scan.

43. A method according to claim 42, wherein said illuminating step includes changing the size b of the exposure light during the scan.

44. A method according to claim 42, wherein said illuminating step includes changing an intensity distribution of the exposure light with respect to the scan direction, during the scan.

45. A method according to claim 33, wherein a relation $|N_{op}-N_{st}|\cdot b<0.72\cdot\Delta l$ is satisfied.

46. A method according to claim 33, further comprising discriminating whether a relation $|N_{op}-N_{st}|\cdot b<\Delta l$ is satisfied and discontinuing the scanning exposure when the relation is not satisfied, wherein said discriminating step and said discontinuing step are carried out before said illuminating step and said scanning step.

47. A device manufacturing method for manufacturing a device, said method comprising the steps of:

illuminating an original with exposure light and projecting, by a projection optical system, a pattern of the illuminated original onto a substrate with a projection magnification of the projection system;

scanning the original and the substrate in a scan direction, to manufacture a device; and changing the projection magnification during the scan, by adjusting the projection optical system, so that an image of the pattern is superposed on a pattern region on the substrate.

48. A method according to claim 47, wherein said scanning step includes changing a ratio between a scan speed of the original and a scan of the substrate.

* * * * *

UNITED STATES PATENT AND TRADEMARK OFFICE
CERTIFICATE OF CORRECTION

PATENT NO. : 5,822,043
DATED : October 13, 1998
INVENTOR(S) : Ryuichi Ebinuma

It is certified that error appears in the above-identified patent and that said Letters Patent is hereby corrected as shown below:

TITLE PAGE:

At item [57], in the ABSTRACT
Line 6, "In" should read --in--;
Line 8, "$N_{op}$" should read --$N_{op}$,--; and
Line 12, "$\Delta 1$." should read --$\Delta$,--.

IN THE DISCLOSURE:

Column 1:
Line 18, "relatively" should read --relative--.

Column 2:
Line 6, "$b/V_r$, the" should read --$b/V_r$, the--;
Line 18, "In" should read --in--;
Line 28, "such" should read --such an--;
Line 46, "as" should be deleted;
Line 52, "from" should read --form--; and
Line 60, "above," should read --above.--.

Column 3:
Line 52, "In" should read --in--.

Column 4:
Line 12, "12." should read --12,--; and
Line 28, "change" should read --changes--.

Column 6:
Line 5, "that;" should read --that:--;
Line 33, "$I(x') = 1/[\ |N_{op}N_{st}|b]$  (16)" should read
--  $I(x') = 1/[\ |N_{op}-N_{st}|b]$  (16) --;
Line 37, "$F(u) = [\sin(\pi|N_{op}-N_{st}|bu)]/[\ |N_{op}-N_{st}|bu]$ (17)" should
read -- $F(u) = [\sin(\pi|N_{op}-N_{st}|bu)]/[\pi|N_{op}-N_{st}|bu]$  (17) --;
Line 43, "satisfied;" should read --satisfied:--; and
Line 58, "follows" should read --follows:--; and
Line 64, "$|N_{op}N_{st}|b \geq 0.72\Delta 1$" should read --$|N_{op}N_{st}|b \leq 0.72\Delta 1$--.

UNITED STATES PATENT AND TRADEMARK OFFICE
CERTIFICATE OF CORRECTION

PATENT NO. : 5,822,043
DATED : October 13, 1998
INVENTOR(S) : Ryuichi Ebinuma

It is certified that error appears in the above-identified patent and that said Letters Patent is hereby corrected as shown below:

<u>Column 7</u>:
Line 15, "smaller o." should read --smaller $\sigma$.--.

<u>Column 8</u>:
Line 26, "tor As" should read --tor. As--;
Line 64, "$b_{min} \leq m/ | M_{op}-N_{st} |$" should read -- $b_{min} \leq m/ | N_{op}-N_{st} |$ --; and
Line 67, "procedure ." should read --procedure.--.

<u>Column 9</u>:
Line 19, "scan" should read --scanning--; and
Line 62, "6uch" should read --such--.

<u>Column 11</u>:
Line 59, "claim 17" should read --claim 17,--.

Signed and Sealed this

Third Day of July, 2001

*Nicholas P. Godici*

Attest:

NICHOLAS P. GODICI
*Attesting Officer*    *Acting Director of the United States Patent and Trademark Office*